US011159873B2

(12) United States Patent
Zeng et al.

(10) Patent No.: US 11,159,873 B2
(45) Date of Patent: Oct. 26, 2021

(54) WIRELESS HEADPHONE SYSTEM, WIRELESS HEADPHONE, AND BASE

(71) Applicant: YEALINK (XIAMEN) NETWORK TECHNOLOGY CO., LTD., Fujian (CN)

(72) Inventors: Chaofan Zeng, Fujian (CN); Xiaosheng Lin, Fujian (CN); Rongfu Lu, Fujian (CN)

(73) Assignee: YEALINK (XIAMEN) NETWORK TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 16/994,572

(22) Filed: Aug. 15, 2020

(65) Prior Publication Data
US 2021/0051388 A1   Feb. 18, 2021

(30) Foreign Application Priority Data

Aug. 15, 2019 (CN) .......................... 201910753676.0
Aug. 15, 2019 (CN) .......................... 201921331206.7

(51) Int. Cl.
*H04R 1/10*   (2006.01)
(52) U.S. Cl.
CPC ......... *H04R 1/1041* (2013.01); *H04R 1/1025* (2013.01); *H04R 1/1058* (2013.01); *H04R 2420/07* (2013.01)
(58) Field of Classification Search
CPC ..... H04L 2012/40215; H04L 12/40032; H04L 12/40169; H04L 12/417; H04L 25/0286; H04L 25/085; H04L 12/413; H04L 2012/40273; H04L 25/028; H04L 25/0328; H04L 25/08; H04L 12/40013; H04L 12/40039; H04L 12/40078; H04L 12/40123; H04L 12/4015; H04L 2012/40267; H04L 25/0272; H04L 12/40006; H04L 12/40143; H04L 12/403; H04L 12/4135; H04L 12/4625;
(Continued)

(56) References Cited

U.S. PATENT DOCUMENTS 6,191,634 B1 * 2/2001 Haseyama .......... G06F 13/4072
326/68
6,519,448 B1 * 2/2003 Dress .................... H03J 1/0091
381/311
(Continued)

*Primary Examiner* — Lun-See Lao

(57) ABSTRACT

A wireless headphone system, a wireless headphone, and a base. The wireless headphone system includes the wireless headphone and the base. The base includes a base RXD wire, a base TXD wire, a base connection wire, and a base triode; and the wireless headphone includes a wireless headphone RXD wire, a wireless headphone TXD wire, a wireless headphone connection wire, and a wireless headphone transistor. The base RXD wire and the base TXD wire are connected together through the base transistor and led out through the base connection wire. The wireless headphone RXD wire and the wireless headphone TXD wire are connected together through the wireless headphone transistor and led out through the wireless headphone connection wire. When the headphone is charged on the base, two-way communication between the headphone and the base can still be implemented while maintaining the existing three-wire design.

4 Claims, 1 Drawing Sheet

(58) Field of Classification Search
CPC ......... H04L 1/0083; H04L 2012/40234; H04L 45/30; H04L 5/16; H04B 10/11; H04B 1/401; H04R 1/1025; H04R 1/1041; H04R 1/1058; H04R 2420/07; H04R 2420/09; H04W 76/15; H04W 84/042; H04W 88/02; H04W 88/06
USPC .................. 381/150, 182, 370, 74, 374, 380
See application file for complete search history.

(56) References Cited

U.S. PATENT DOCUMENTS

| | | | | |
|---|---|---|---|---|
| 7,853,035 | B2* | 12/2010 | Tsunoda ............... | H04R 1/1025 381/377 |
| 8,867,776 | B2* | 10/2014 | Schul ....................... | H04R 5/02 381/394 |
| 2002/0149404 | A1* | 10/2002 | De Haas ............... | H04L 25/028 327/112 |
| 2010/0054732 | A1* | 3/2010 | Chenc .................... | H04B 10/11 398/9 |

* cited by examiner

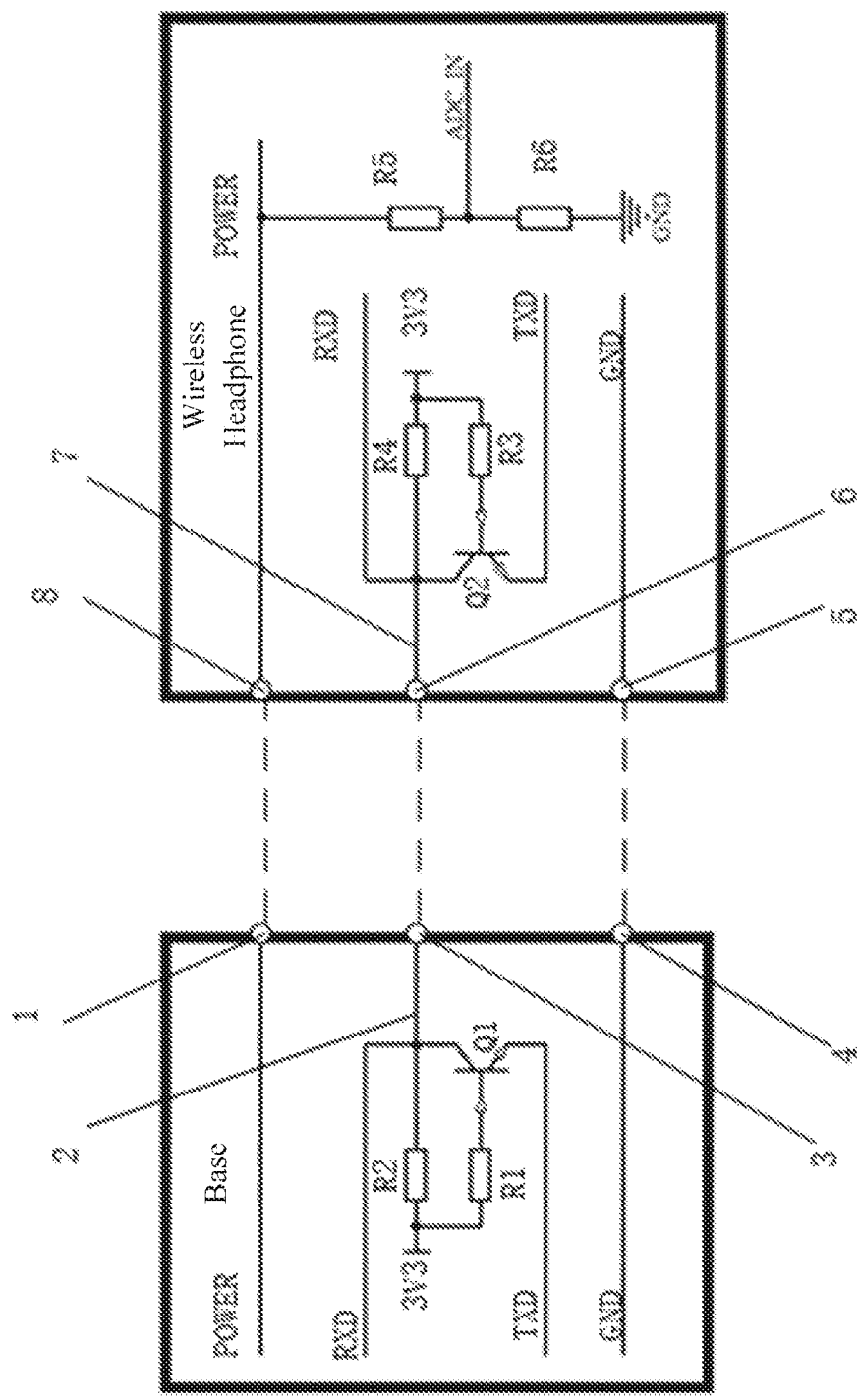

WIRELESS HEADPHONE SYSTEM, WIRELESS HEADPHONE, AND BASE

CROSS-REFERENCE TO RELATED APPLICATIONS

The present application claims the benefit of Chinese Patent Application Nos. 201910753676.0 and 201921331206.7 both filed on Aug. 15, 2019, the contents of which are hereby incorporated by reference.

TECHNICAL FIELD

The present disclosure relates to the field of communication technology, and in particular, to a wireless headphone system, a wireless headphone, and a base.

BACKGROUND

With the progress of the times, collaborative office as a product of the development of the Internet plays an important role in daily work. As a peripheral of desktop computers and phone sets, wireless headphones can free workers from the desktop constraint and move freely in the work area. As a portable device, a wireless headphone only requires a base to be connected to a computer or phone set to transmit the audio signals of the computer or phone set to the wireless headphone, and transmit the audio signals of the wireless headphone back to the computer or phone set. Pairing is required before communication is established between the base and the headphone. In addition, the headphone needs to be charged through the base.

However, due to the limitation of the structural design, the existing wireless headphones and bases only allow three pogo pins, that is, three connection wires. Because the headphone needs to be charged in the base, a power supply and ground are required to form a loop, which requires two wires. Only one wire is left for the communication between the headphone and the base, so it is necessary to implement duplex on a single wire. The existing single-wire half-duplex solutions can only be supported by STM single-chip microcomputers. In the STM series, UART supports single-wire half-duplex communication. When both communication parties are STM single-chip microcomputers, the TXD wires on both sides are connected and the internal registers of the chips are set to implement single-wire half-duplex communication. In other common chips with UART interfaces, the TXD wires of the communication parties cannot be directly connected; otherwise, conflicts will occur and switching cannot be implemented. Therefore, in the existing three-wire design, the common chips do not support two-way communication between the headphone and the base when the headphone is charged on the base.

SUMMARY

Embodiments of the present disclosure provide a wireless headphone system, a wireless headphone, and a base, to implement two-way communication between the base and the headphone charged on the base under the existing three-wire design.

An embodiment of the present disclosure provides a wireless headphone system, including a wireless headphone and a base, where the base includes a base power wire, a base ground wire, a base RXD wire, a base TXD wire, a base connection wire, a base transistor, a base power supply, a first base contact, a second base contact, a third base contact, a first resistor, and a second resistor;

the base RXD wire is connected to a collector of the base transistor; an emitter of the base transistor is connected to the base TXD wire; a base of the base transistor is connected to one terminal of the first resistor; the other terminal of the first resistor is connected to the base power supply; one terminal of the second resistor is connected to the base power supply, and the other terminal of the second resistor is connected to the collector of the base transistor; the base power wire is connected to the first base contact; the base ground wire is connected to the second base contact; one end of the base connection wire is connected to the collector of the base transistor, and the other end of the base connection wire is connected to the third base contact;

the wireless headphone includes a wireless headphone power wire, a wireless headphone ground wire, a wireless headphone RXD wire, a wireless headphone TXD wire, a wireless headphone connection wire, a wireless headphone transistor, a wireless headphone power supply, a first wireless headphone contact, a second wireless headphone contact, a third wireless headphone contact, a third resistor, and a fourth resistor;

the wireless headphone RXD wire is connected to a collector of the wireless headphone transistor; an emitter of the wireless headphone transistor is connected to the wireless headphone TXD wire; a base of the wireless headphone transistor is connected to one terminal of the third resistor; the other terminal of the third resistor is connected to the wireless headphone power supply; one terminal of the fourth resistor is connected to the wireless headphone power supply, and the other terminal of the fourth resistor is connected to the collector of the wireless headphone transistor; the wireless headphone power wire is connected to the first wireless headphone contact; the wireless headphone ground wire is connected to the second wireless headphone contact; one end of the wireless headphone connection wire is connected to the collector of the wireless headphone transistor, and the other end of the wireless headphone connection wire is connected to the third wireless headphone contact.

Further, the wireless headphone further includes a power detection circuit, where the power detection circuit includes a fifth resistor and a sixth resistor; and One terminal of the fifth resistor is connected to the wireless headphone power wire, and the other terminal of the fifth resistor is connected to one terminal of the sixth resistor and an analog-to-digital sampling port (ADC_IN) of a wireless headphone chip; and the other terminal of the sixth resistor is grounded.

Another embodiment of the present disclosure provides a wireless headphone, including a wireless headphone power wire, a wireless headphone ground wire, a wireless headphone RXD wire, a wireless headphone TXD wire, a wireless headphone connection wire, a wireless headphone transistor, a wireless headphone power supply, a first wireless headphone contact, a second wireless headphone contact, a third wireless headphone contact, a third resistor, and a fourth resistor;

the wireless headphone RXD wire is connected to a collector of the wireless headphone transistor; an emitter of the wireless headphone transistor is connected to the wireless headphone TXD wire; a base of the wireless headphone transistor is connected to one terminal of the third resistor; the other terminal of the third resistor is connected to the wireless headphone power supply; one terminal of the fourth resistor is connected to the wireless headphone power supply, and the other terminal of the fourth resistor is connected to the collector of the wireless headphone transistor; the wireless headphone power wire is connected to the first wireless headphone contact; the wireless headphone ground wire is connected to the second wireless headphone contact; one end of the wireless headphone connection wire is connected to the collector of the wireless headphone transistor, and the other end of the wireless headphone connection wire is connected to the third wireless headphone contact.

Further, the wireless headphone includes a power detection circuit, where the power detection circuit includes a fifth resistor and a sixth resistor; and One terminal of the fifth resistor is connected to the wireless headphone power wire, and the other terminal of the fifth resistor is connected to one terminal of the sixth resistor and an analog-to-digital sampling port (ADC_IN) of a wireless headphone chip; and the other terminal of the sixth resistor is grounded.

Yet another embodiment of the present disclosure provides a base, including a base power wire, a base ground wire, a base RXD wire, a base TXD wire, a base connection wire, a base transistor, a base power supply, a first base contact, a second base contact, a third base contact, a first resistor, and a second resistor;

the base RXD wire is connected to a collector of the base transistor; an emitter of the base transistor is connected to the base TXD wire; a base of the base transistor is connected to one terminal of the first resistor; the other terminal of the first resistor is connected to the base power supply; one terminal of the second resistor is connected to the base power supply, and the other terminal of the second resistor is connected to the collector of the base transistor; the base power wire is connected to the first base contact; the base ground wire is connected to the second base contact; one end of the base connection wire is connected to the collector of the base transistor, and the other end of the base connection wire is connected to the third base contact.

The embodiments of the present disclosure have the following beneficial effects:

The embodiments of the present disclosure provide a wireless headphone system, a wireless headphone, and a base, where the wireless headphone system includes the wireless headphone and the base. Among the three wires of the serial communication protocol, TXD and RXD are used for one-way communication. When the TXD and RXD wires are connected together, two-way communication can be implemented. Therefore, when the wireless headphone is placed in the base, a first base contact and a first headphone contact, a second base contact and a second headphone contact, as well as a third base contact and a third headphone contact are connected in pairs. In this case, the RXD wires of the base and the headphone, as well as the TXD wires of the base and the headphone, are bridged through connection wires of the base and the headphone, to realize two-way communication. If the two TXD wires are directly connected, the TXD wires output TTL levels, and no OC gate or OD gate can be configured inside chips. For example, when the TXD wire of the base outputs a high level (that is, the gate is closed) while the TXD wire of the wireless headphone outputs a low level (that is, the door is open), due to the very low output impedance in a push-pull output circuit, a low-resistance path is provided for power supply when the output ends are connected. As a result, large currents flow through two output ports, and IO ports will be damaged due to overload. In addition, when the two output ends are connected, an output logical level has an intermediate state, causing communication failure. Therefore, a base transistor and a wireless headphone transistor need to be added to separate the two TXD wires to form the OC gate, and pull-up resistors, including the first, second, third, and fourth resistors are added. This ensures that when one TXD does not work, the level can be pulled high, to finally implement two-way communication. In this way, the wireless headphone being charged can still perform two-way communication with the base, without changing the number of base contacts and wireless headphone contacts, that is, under the three-wire design without STM chips.

BRIEF DESCRIPTION OF DRAWINGS

The FIGURE is a schematic structural diagram of a wireless headphone system according to an embodiment of the present disclosure.

Reference numbers: first base contact 1, base connection wire 2, third base contact 3, second base contact 4, second wireless headphone contact 5, third wireless headphone contact 6, wireless headphone connection wire 7, and first wireless headphone contact 8.

DETAILED DESCRIPTION

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

As shown in the FIGURE, a wireless headphone system according to an embodiment of the present disclosure includes a wireless headphone and a base.

The base includes a base power wire (POWER at the base end in the FIGURE), a base ground wire (GND at the base end in the FIGURE), a base RXD wire (RXD at the base end in the FIGURE), a base TXD wire (TXD at the base end in the FIGURE), a base connection wire (2), a base transistor (Q1), a base power supply (3.3 V at the base end in the FIGURE), a first base contact (1), a second base contact (4), a third base contact (3), a first resistor (R1), and a second resistor (R2).

The base RXD wire is connected to a collector of the base transistor; an emitter of the base transistor is connected to the base TXD wire; a base of the base transistor is connected to one terminal of the first resistor; the other terminal of the first resistor is connected to the base power supply; one terminal of the second resistor is connected to the base power supply, and the other terminal of the second resistor is connected to the collector of the base transistor; the base power wire is connected to the first base contact; the base ground wire is connected to the second base contact; one end of the base connection wire is connected to the collector of the base transistor, and the other end of the base connection wire is connected to the third base contact.

The wireless headphone includes a wireless headphone power wire (POWER at the wireless headphone end in the FIGURE), a wireless headphone ground wire (GND at the wireless headphone end in the FIGURE), a wireless headphone RXD wire (RXD at the wireless headphone end in the FIGURE), a wireless headphone TXD wire (TXD at the wireless headphone end in the FIGURE), a wireless headphone connection wire (7), a wireless headphone transistor (Q2), a wireless headphone power supply (3.3 V at the wireless headphone end in the FIGURE), a first wireless headphone contact (8), a second wireless headphone contact (5), a third wireless headphone contact (6), a third resistor (R3), and a fourth resistor (R4).

The wireless headphone RXD wire is connected to a collector of the wireless headphone transistor; an emitter of the wireless headphone transistor is connected to the wireless headphone TXD wire; a base of the wireless headphone transistor is connected to one terminal of the third resistor; the other terminal of the third resistor is connected to the wireless headphone power supply; one terminal of the fourth resistor is connected to the wireless headphone power supply, and the other terminal of the fourth resistor is connected to the collector of the wireless headphone transistor; the wireless headphone power wire is connected to the first wireless headphone contact; the wireless headphone ground wire is connected to the second wireless headphone contact; one end of the wireless headphone connection wire is connected to the collector of the wireless headphone transistor, and the other end of the wireless headphone connection wire is connected to the third wireless headphone contact.

It should be noted that the connection lines between the contacts of the wireless headphone and the base in the FIGURE represent the connection of the contacts between the wireless headphone and the base when the wireless headphone is inserted into the base.

Specifically, the power wire and the ground wire at the base end are two necessary connection wires for charging. On the base, an additional 9014 transistor (or another type of transistor, which can be adjusted according to the actual situation) is connected to the UART TXD, a base and a collector are pulled up to 3.3 V (or another voltage value, which can be adjusted according to the actual situation) by using two 10k resistors R1 and R2 (or another resistance value, which can be adjusted according to the actual situation), and the emitter of the Q1 transistor is controlled by using the TXD. When the base TXD wire sends a low level, the Q1 transistor is turned on, and the collector also outputs a low level; when the base TXD wire sends a high level, the Q1 transistor is turned off, and an output of the collector is pulled up to 3.3 V, which is a high level. In this way, the output of the collector of the Q1 transistor is in the same direction as the emitter or the base TXD wire. The collector of the Q1 transistor is connected to the base RXD wire, to form a single-wire communication port at the base end. The same is true for the headphone end, and details are not repeated herein.

In a preferred embodiment, the wireless headphone further includes a power detection circuit, where the power detection circuit includes a fifth resistor (R5) and a sixth resistor (R6); and One terminal of the fifth resistor is connected to the wireless headphone power wire, and the other terminal of the fifth resistor is connected to one terminal of the sixth resistor and an analog-to-digital sampling port (ADC_IN) of a wireless headphone chip; and the other terminal of the sixth resistor is grounded.

In the power detection circuit of the wireless headphone, power is divided through R5 and R6, and then connected to the analog-to-digital sampling port ADC_IN of the headphone chip. If a voltage collected by the analog-to-digital sampling port is a high level, the headphone is connected to the base for charging, and can communicate with the base at the same time. In this way, every time the headphone is placed into the base, the headphone can know that it has been placed into the base, and inform the base of this.

In an actual application scenario, a user wants to use a wireless headphone with a base, and places the wireless headphone into the base. In this case, the base supplies power to the wireless headphone to charge it. When detecting the power input, the wireless headphone knows that it has been placed into the base, and sends a pairing message to the base. After receiving the pairing message, the base sends back a message, indicating that the pairing message has been received and the pairing is completed. If the base is subject to external electrostatic interference, or is in poor contact due to human touch when sending back a message, the wireless headphone sends a pairing message again. In this case, a LINK pin (the base connection wire and wireless headphone connection wire) transmits the TXDs of the base and the wireless headphone at the same time. After receiving the message, the RXD of the base compares the TXD with the TXD of the base and finds that they are inconsistent. This means that the wireless headphone is also sending a message, and the messages conflict. The RXD of the wireless headphone also receives the message, and compares the TXD with the TXD of the wireless headphone but finds that they are inconsistent. The messages are considered duplicate. In this case, the primary device resends a message, and the secondary device waits. The user only needs to pre-configure the base as the primary device and the wireless headphone as the secondary device. Upon the conflict, the base resends a message and the wireless headphone waits for the message. Through this circuit, POWER and GND implement the charging of the headphone; and the LINK pin (the base connection wire and wireless headphone connection wire) and GND implement the two-way communication between the base and the headphone.

It should be noted that the contacts of the base are the three pogo pins on the base and the contacts of the wireless headphone are the three pogo pins on the wireless headphone. In the embodiments of the present disclosure, the wireless headphone and the base communicate with each other over a serial communication protocol. The transmission rate at a specific serial GPIO port can be increased. However, the transmission rate at a common GPIO port compliant with a custom protocol cannot be increased. The custom protocol is complex and has risks. In the present disclosure, the connections between the chip and the corresponding TXD wire, RXD wire, power wire, and ground wire inside the wireless headphone and the base are the conventional technologies, and details are not repeated herein.

Another embodiment is provided on the basis of the foregoing embodiment.

Another embodiment of the present disclosure provides a wireless headphone, including a wireless headphone power wire, a wireless headphone ground wire, a wireless headphone RXD wire, a wireless headphone TXD wire, a wireless headphone connection wire, a wireless headphone transistor, a wireless headphone power supply, a first wireless headphone contact, a second wireless headphone contact, a third wireless headphone contact, a third resistor, and a fourth resistor.

The wireless headphone RXD wire is connected to a collector of the wireless headphone transistor; an emitter of the wireless headphone transistor is connected to the wireless headphone TXD wire; a base of the wireless headphone transistor is connected to one terminal of the third resistor; the other terminal of the third resistor is connected to the wireless headphone power supply; one terminal of the fourth resistor is connected to the wireless headphone power supply, and the other terminal of the fourth resistor is connected to the collector of the wireless headphone transistor; the wireless headphone power wire is connected to the first wireless headphone contact; the wireless headphone ground wire is connected to the second wireless headphone contact; one end of the wireless headphone connection wire is connected to the collector of the wireless headphone transistor, and the other end of the wireless headphone connection wire is connected to the third wireless headphone contact.

Preferably, the wireless headphone further includes a power detection circuit, where the power detection circuit includes a fifth resistor and a sixth resistor; and one terminal of the fifth resistor is connected to the wireless headphone power wire, and the other terminal of the fifth resistor is connected to one terminal of the sixth resistor and an analog-to-digital sampling port (ADC_IN) of a wireless headphone chip; and the other terminal of the sixth resistor is grounded.

The wireless headphone in this embodiment has a same structure as the wireless headphone in the foregoing wireless headphone system embodiment. Details are not repeated herein.

On the basis of the wireless headphone system embodiment of the present disclosure, another embodiment is correspondingly provided. Another embodiment of the present disclosure provides a base, including a base power wire, a base ground wire, a base RXD wire, a base TXD wire, a base connection wire, a base transistor, a base power supply, a first base contact, a second base contact, a third base contact, a first resistor, and a second resistor.

The base RXD wire is connected to a collector of the base transistor; an emitter of the base transistor is connected to the base TXD wire; a base of the base transistor is connected to one terminal of the first resistor; the other terminal of the first resistor is connected to the base power supply; one terminal of the second resistor is connected to the base power supply, and the other terminal of the second resistor is connected to the collector of the base transistor; the base power wire is connected to the first base contact; the base ground wire is connected to the second base contact; one end of the base connection wire is connected to the collector of the base transistor, and the other end of the base connection wire is connected to the third base contact.

The base in this embodiment has a same structure as the base in the foregoing wireless headphone system embodiment. Details are not repeated herein.

The embodiments of the present disclosure have the following beneficial effects:

An embodiment of the present disclosure provides a wireless headphone system, a wireless headphone, and a base, where the wireless headphone system includes the wireless headphone and the base. Among the three wires of the serial communication protocol, TXD and RXD are used for one-way communication. When the TXD and RXD wires are connected together, two-way communication can be implemented. Therefore, when the wireless headphone is placed in the base, a first base contact and a first headphone contact, a second base contact and a second headphone contact, as well as a third base contact and a third headphone contact are connected in pairs. In this case, the RXD wires of the base and the headphone, as well as the TXD wires of the base and the headphone, are bridged through connection wires of the base and the headphone, to realize two-way communication. If the two TXD wires are directly connected, the TXD wires output TTL levels, and no OC gate or OD gate can be configured inside chips. For example, when the TXD wire of the base outputs a high level (that is, the gate is closed) while the TXD wire of the wireless headphone outputs a low level (that is, the door is open), due to the very low output impedance in a push-pull output circuit, a low-resistance path is provided for power supply when the output ends are connected. As a result, large currents flow through two output ports, and IO ports will be damaged due to overload. In addition, when the two output ends are connected, an output logical level has an intermediate state, causing communication failure. Therefore, a base transistor and a wireless headphone transistor need to be added to separate the two TXD wires to form the OC gate, and pull-up resistors, including the first, second, third, and fourth resistors are added. This ensures that when one TXD does not work, the level can be pulled high, to finally implement two-way communication. In this way, the wireless headphone being charged can still perform two-way communication with the base, without changing the number of base contacts and wireless headphone contacts, that is, under the three-wire design without STM chips.

The descriptions above are preferred implementations of the present disclosure, and it should be noted that for those of ordinary skill in the art, various improvements and modifications can be made without departing from the principles of the present disclosure. These improvements and modifications should also be regarded as falling into the protection scope of the present disclosure.

The invention claimed is:

1. A wireless headphone system, comprising a wireless headphone and a base, wherein the base comprises a base power wire, a base ground wire, a base RXD wire, a base TXD wire, a base connection wire, a base transistor, a base power supply, a first base contact, a second base contact, a third base contact, a first resistor, and a second resistor;

the base RXD wire is connected to a collector of the base transistor; an emitter of the base transistor is connected to the base TXD wire; a base of the base transistor is connected to one terminal of the first resistor; the other terminal of the first resistor is connected to the base power supply; one terminal of the second resistor is connected to the base power supply, and the other terminal of the second resistor is connected to the collector of the base transistor; the base power wire is connected to the first base contact; the base ground wire is connected to the second base contact; one end of the base connection wire is connected to the collector of the base transistor, and the other end of the base connection wire is connected to the third base contact;

the wireless headphone comprises a wireless headphone power wire, a wireless headphone ground wire, a wireless headphone RXD wire, a wireless headphone TXD wire, a wireless headphone connection wire, a wireless headphone transistor, a wireless headphone power supply, a first wireless headphone contact, a second wireless headphone contact, a third wireless headphone contact, a third resistor, and a fourth resistor;

the wireless headphone RXD wire is connected to a collector of the wireless headphone transistor; an emitter of the wireless headphone transistor is connected to the wireless headphone TXD wire; a base of the wireless headphone transistor is connected to one terminal of the third resistor; the other terminal of the third resistor is connected to the wireless headphone power supply; one terminal of the fourth resistor is connected to the wireless headphone power supply, and the other terminal of the fourth resistor is connected to the collector of the wireless headphone transistor; the wireless headphone power wire is connected to the first wireless headphone contact; the wireless headphone ground wire is connected to the second wireless headphone contact; one end of the wireless headphone connection wire is connected to the collector of the wireless headphone transistor, and the other end of the wireless headphone connection wire is connected to the third wireless headphone contact.

2. The wireless headphone system according to claim 1, wherein the wireless headphone further comprises a power detection circuit, wherein the power detection circuit comprises a fifth resistor and a sixth resistor; and one terminal of the fifth resistor is connected to the wireless headphone power wire, and the other terminal of the fifth resistor is connected to one terminal of the sixth resistor and an analog-to-digital sampling port (ADC_IN) of a wireless headphone chip; and the other terminal of the sixth resistor is grounded.

3. A wireless headphone, comprising a wireless headphone power wire, a wireless headphone ground wire, a wireless headphone RXD wire, a wireless headphone TXD wire, a wireless headphone connection wire, a wireless headphone transistor, a wireless headphone power supply, a first wireless headphone contact, a second wireless headphone contact, a third wireless headphone contact, a third resistor, and a fourth resistor;

the wireless headphone RXD wire is connected to a collector of the wireless headphone transistor; an emitter of the wireless headphone transistor is connected to the wireless headphone TXD wire; a base of the wireless headphone transistor is connected to one terminal of the third resistor; the other terminal of the third resistor is connected to the wireless headphone power supply; one terminal of the fourth resistor is connected to the wireless headphone power supply, and the other terminal of the fourth resistor is connected to the collector of the wireless headphone transistor; the wireless headphone power wire is connected to the first wireless headphone contact; the wireless headphone ground wire is connected to the second wireless headphone contact; one end of the wireless headphone connection wire is connected to the collector of the wireless headphone transistor, and the other end of the wireless headphone connection wire is connected to the third wireless headphone contact.

4. The wireless headphone according to claim 3, further comprising a power detection circuit, wherein the power detection circuit comprises a fifth resistor and a sixth resistor; and one terminal of the fifth resistor is connected to the wireless headphone power wire, and the other terminal of the fifth resistor is connected to one terminal of the sixth resistor and an analog-to-digital sampling port (ADC_IN) of a wireless headphone chip; and the other terminal of the sixth resistor is grounded.

\* \* \* \* \*